United States Patent
Boardman et al.

(10) Patent No.: US 11,327,531 B2
(45) Date of Patent: May 10, 2022

(54) FOLDABLE DISPLAY PANEL WITH SHOCK ABSORBER

(71) Applicant: SHARP KABUSHIKI KAISHA, Sakai (JP)

(72) Inventors: Edward Andrew Boardman, Abingdon (GB); Tim Michael Smeeton, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/038,533

(22) Filed: Sep. 30, 2020

(65) Prior Publication Data
US 2022/0102671 A1    Mar. 31, 2022

(51) Int. Cl.
*G06F 1/16*    (2006.01)

(52) U.S. Cl.
CPC .......... *G06F 1/1641* (2013.01); *G06F 1/1656* (2013.01)

(58) Field of Classification Search
CPC .............................. G06F 1/1641; G06F 1/1656
See application file for complete search history.

(56) References Cited

U.S. PATENT DOCUMENTS

| | | | |
|---|---|---|---|
| 10,198,038 B2 | 2/2019 | Jang et al. | |
| 2017/0153668 A1* | 6/2017 | Jang | G06F 1/1641 |
| 2018/0053451 A1* | 2/2018 | Han | H01L 51/5253 |
| 2018/0102496 A1 | 4/2018 | Kim et al. | |
| 2018/0175311 A1* | 6/2018 | Jin | H01L 27/3258 |
| 2019/0061318 A1* | 2/2019 | Jung | G06F 3/041 |
| 2019/0104626 A1* | 4/2019 | Jeon | H04M 1/0268 |
| 2019/0334114 A1* | 10/2019 | Park | H01L 51/0097 |
| 2020/0068725 A1 | 2/2020 | Park et al. | |
| 2020/0134278 A1* | 4/2020 | Lee | G06F 1/1626 |
| 2020/0159287 A1* | 5/2020 | Jeong | G09F 9/301 |

FOREIGN PATENT DOCUMENTS

WO    2019/132194 A    7/2019

* cited by examiner

*Primary Examiner* — Rockshana D Chowdhury
(74) *Attorney, Agent, or Firm* — ScienBiziP, P.C.

(57) ABSTRACT

A shock-absorbing display panel apparatus for folding flat screen displays, the shock-absorbing apparatus includes a planar display layer comprising a viewing surface and an opposing non-viewing surface, the display layer further comprising at least one folding region and at least one non-folding region for folding along at least one axis of rotation; a shock absorber in co-planar peripheral contour with the display layer, the shock absorber having at least one first discontinuity sub-dividing the shock absorber into physically separate regions; an adhesive layer disposed between the shock absorber and the non-viewing surface; and wherein the adhesive layer has at least one second discontinuity between the shock absorber and the display panel in the at least one folding region of the display layer.

20 Claims, 7 Drawing Sheets

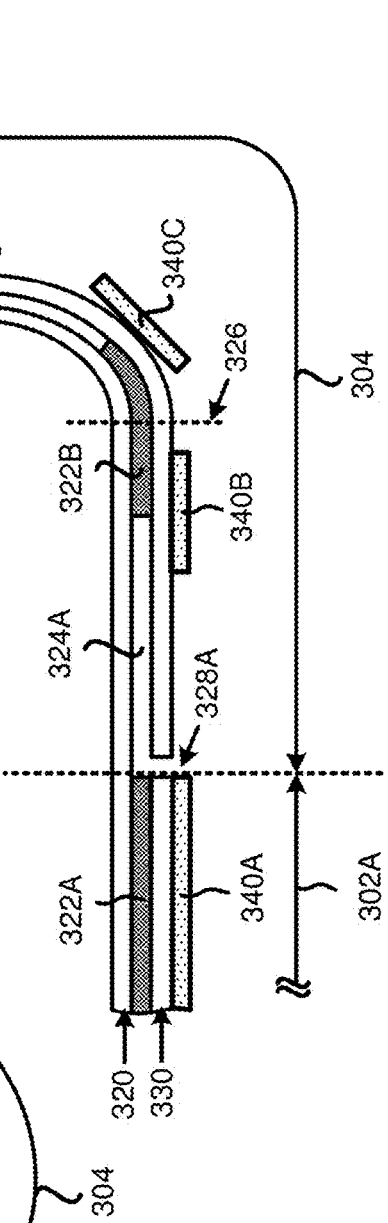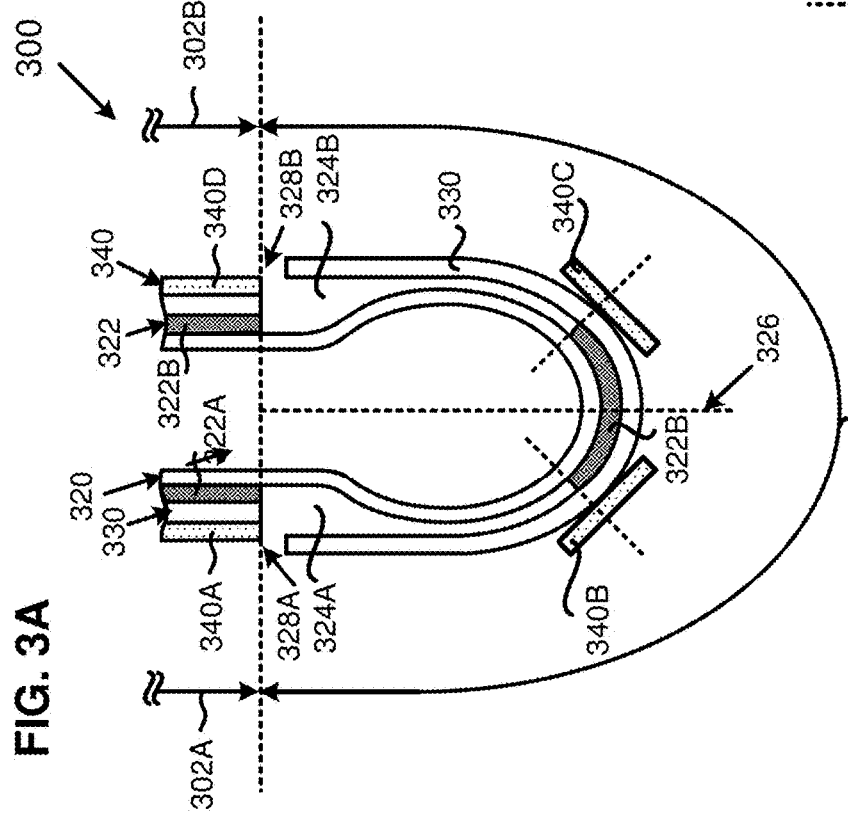

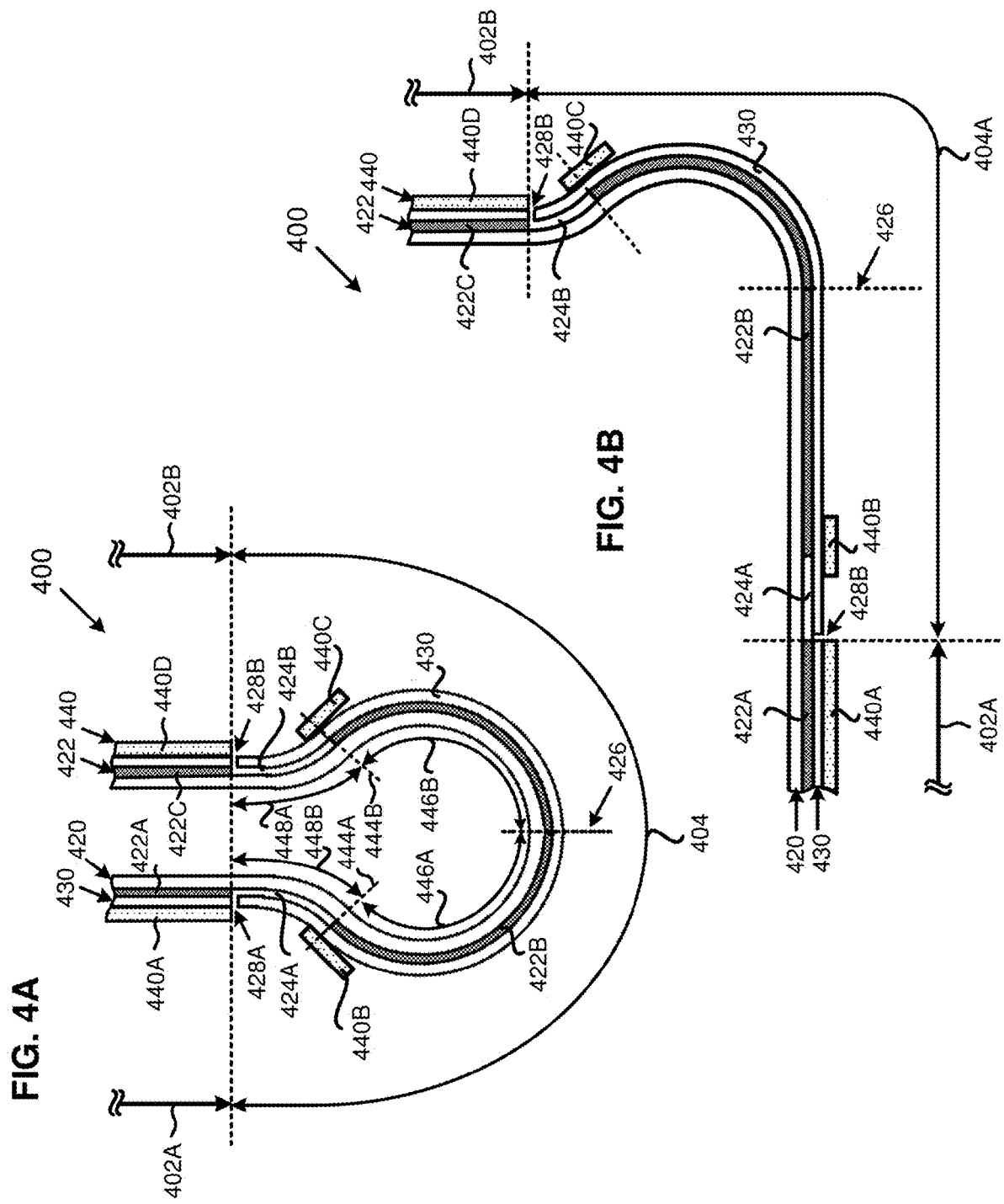

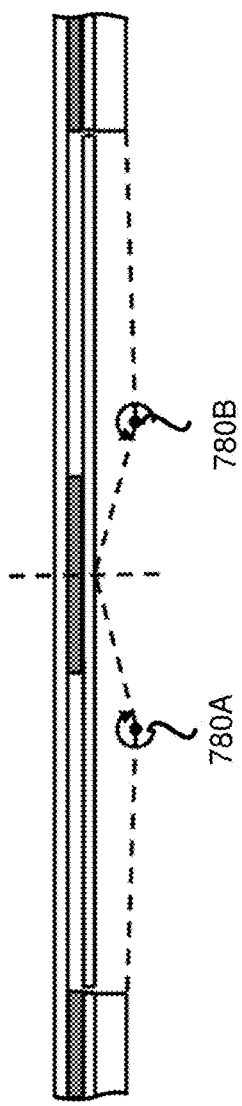
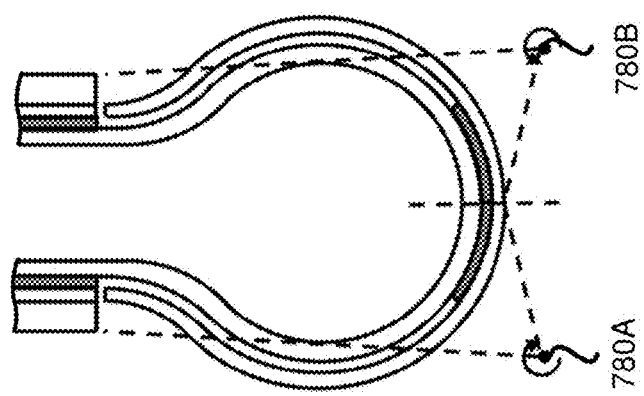
FIG. 7A
FIG. 7B

FOLDABLE DISPLAY PANEL WITH SHOCK ABSORBER

FIELD

The present disclosure generally relates to displays, and in particular relates to structures and bonding geometries of information displays, especially for use in mobile applications (e.g., cell phone, tablet computer, notebook computer, etc.). The structures are applicable to displays based on light emitting diodes (LED), for example, an organic LED (OLED) display.

BACKGROUND

An information display device may include a stack of layers, for example a matrix of OLEDs disposed on a substrate, a touch sensor, and an optical polarizer. These layers may be bonded together using adhesive layers. The display device may further be bonded to a cover window, which the light from the display is emitted through, with the cover window providing a physical protection of the layers in the display. The display may further be mounted into a housing, which typically supports the display and provides protection of the layers of the display on the surface opposite to the cover window and around the edges of the display.

Information display devices may be foldable such that their shapes are changed repeatedly during their use. For example, foldable displays may be bent or folded such that at least some part of the display has a curvature at times and is substantially flat at other times. For foldable displays, it is essential that the cover window can be deformed without failing (e.g., by cracking or yielding) and without requiring a substantial amount of force to cause the deformation. Typically, in order to meet these requirements, the window should be thin and/or comprised of a material with low stiffness. For example, polymer materials may make a suitable window film or glass windows with thickness below 100 µm (i.e., 10^-6 meters). In display devices which are non-bendable (e.g., the shape of the display is not changed repeatedly during its use), it is common to use a relatively thick glass window (e.g., thickness of 400 µm to 700 µm).

Displays comprising thin cover windows or cover windows comprised of a material with low stiffness can be susceptible to damage during impact of an object onto the window of the display because the display can undergo large deformations. To increase the robustness of the display against damage from an impact, the surface of the display device opposite the cover window may be bonded to a shock absorber. To dissipate the energy of an impact while also reducing the deformation of the display typically requires that the shock absorber include a layer with high stiffness. For example, stainless steel with a thickness of 30 µm may be suitable high stiffness layer. However, this high stiffness layer may also resist deformation when folding the display during normal operation. This can lead to failure of the shock absorber (e.g., failure by cracking) or causing other layers in the display to fail due to the high stress caused during bending (e.g., failure by cracking or layer delamination). Therefore, a tradeoff arises between requirements for a display with good impact resistance and suitable properties for foldability of the display.

United States Publication No. US 2020/0068725 A1 (Park et al., published Feb. 27, 2020) describes a chassis design in which layers may be split into two separate regions with a discontinuity at the centre of the folding area to improve folding performance.

United States Publication No. US 2019/0061318 A1 (Jung et al., published Feb. 28, 2019) describes using different adhesive materials in the folding region and non-folding region of a display to improve folding performance.

United States Publication No. US 2018/0102496 A1 (Kim et al., published Apr. 12, 2018) describes introducing holes into the shock absorbing layer of a foldable display in the non-folding region closest to the folding region of the display. This locally reduces the rigidity of the shock absorbing layer and allows deformation to improve folding performance.

U.S. Pat. No. 10,198,038 B2 (Jang et al., published Feb. 5, 2019) describes a shock absorber including a high stiffness layer and a low stiffness layer, where the high stiffness material is removed and replaced with low stiffness material in the folding region of the display to improve the folding performance.

United States Publication No. US 2019/0334114 A1 (Park, Myoung Seo, published Oct. 31, 2019) describes designs for shock absorbing structures for foldable displays and bonding geometries. The shock absorber may be thinned or completely absent in the folding region and the adhesive may be removed in the folding region. Additional material may be added to the back of the panel to contact the shock absorber when the display panel is flat.

International Application Pub. No. WO2019/132194 (Myung et al., published Apr. 7, 2019) describes having multiple cuts in the shock absorber in the folding region of the display, bonded to the display panel by a continuous layer of adhesive. The cuts are arranged symmetrically about the centreline of the fold.

CITATION LIST

United States Publication No. US 2020/0068725 A1 (Park et al., published Feb. 27, 2020).
United States Publication No. US 2019/0061318 A1 (Jung et al., published Feb. 28, 2019).
United States Publication No. US 2018/0102496 A1 (Kim et al., published Apr. 12, 2018).
U.S. Pat. No. 10,198,038 B2 (Jang et al., published Feb. 5, 2019).
United States Publication No. US 2019/0334114 A1 (Park, Myoung Seo, published Oct. 31, 2019).
International Application Pub. No. WO2019/132194 (Myung et al., published Apr. 7, 2019).

SUMMARY

The present disclosure is directed to a foldable display panel with one or more shock absorbers.

In accordance with one aspect of the present disclosure, a shock-absorbing display panel apparatus for folding flat screen displays is provided. The apparatus includes a planar display layer, a shock absorber, an adhesive layer. The planar display layer includes a viewing surface and an opposing non-viewing surface. The display layer further includes at least one folding region and at least one non-folding region for folding along at least one axis of rotation. The shock absorber in co-planar peripheral contour with the display layer, and the shock absorber has at least one first discontinuity sub-dividing the shock absorber into physically separate regions. The adhesive layer is disposed between the shock absorber and the non-viewing surface. The adhesive layer has at least one second discontinuity between the shock absorber and the display panel in the at least one folding region of the display layer.

In an implementation of the first aspect, the folding region includes at least one inward bending region, and at least one outward bending region.

In another implementation of the first aspect, the adhesive layer is discontinuous at one or more points of inflection between the at least one inward bending region and the at least one outward bending region.

In another implementation of the first aspect, the adhesive layer is symmetrical about a plane of the folding region when the folding region has a mirror symmetry plane.

In another implementation of the first aspect, the at least one second discontinuity of the adhesive layer includes an air gap between the display layer and the shock absorber.

In another implementation of the first aspect, the air gap is less than twenty five micrometers in thickness.

In another implementation of the first aspect, the adhesive layer is continuous under the at least one non-folding region.

In another implementation of the first aspect, the adhesive layer is continuous under a center line of the at least one axis of rotation.

In another implementation of the first aspect, the adhesive layer has a thickness of less than twenty five micrometers.

In another implementation of the first aspect, the shock absorber is continuous under the at least one non-folding region.

In another implementation of the first aspect, the at least one first discontinuity of the shock absorber is at an interface of the at least one folding region and the at least one non-folding region.

In another implementation of the first aspect, the shock absorber includes a first layer, a second layer having a stiffness greater than the first layer, and a bonding agent between the first layer and the second layer.

In another implementation of the first aspect, the second layer of the shock absorber and the display layer each have a higher stiffness than the adhesive layer, such that the shock absorber is configured to slide relative to the display layer while remaining attached to the adhesive layer.

In another implementation of the first aspect, the second layer of the shock absorber includes a recess for accommodating the adhesive layer.

In another implementation of the first aspect, the second layer of the shock absorber is thinner in the folding region.

In another implementation of the first aspect, the apparatus further includes at least one housing section. The shock absorber is disposed between the at least one housing section and the adhesive layer.

In another implementation of the first aspect, the at least one housing section is disposed adjacent the shock absorber at the at least one second discontinuity of the adhesive layer.

In another implementation of the first aspect, the at least one housing section is coupled to the shock absorber, thereby governing the position of the shock absorber relative to the display layer.

In another implementation of the first aspect, the folding region includes two axes of rotation.

In another implementation of the first aspect, the apparatus further includes a hinge. The hinge is configured to control a folding path of the display panel such that a center of the folding region does not move relative to the at least one axis of rotation.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

FIG. 3A is a cross-sectional view of a portion of a display structure in a folded state, in accordance with an example implementation of the present disclosure.

FIG. 3B is a cross-sectional view of a portion of the display structure in FIG. 3A in another folded state, in accordance with an example implementation of the present disclosure.

FIG. 4A is a cross-sectional view of a portion of a display structure in a folded state, in accordance with an example implementation of the present disclosure.

FIG. 4B is a cross-sectional view of a portion of the display structure 400 in FIG. 4A in another folded state, in accordance with an example implementation of the present disclosure.

FIG. 7A is a cross-sectional view of a portion of a display structure in an open state, in accordance with an example implementation of the present disclosure.

FIG. 7B is a cross-sectional view of a portion of the display structure in FIG. 7A in a closed state, in accordance with an example implementation of the present disclosure.

DESCRIPTION

Figure 1:
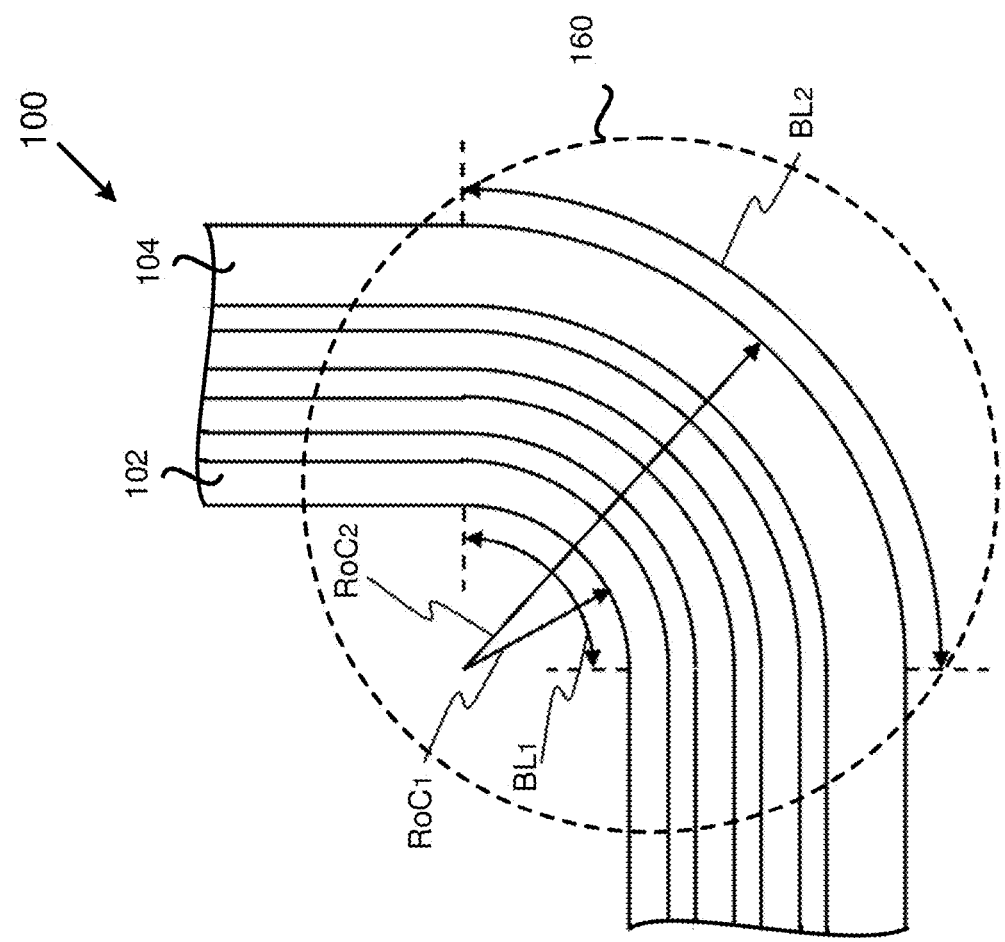
FIG. 1 illustrates a folding region of a display panel in accordance with a related art display.

The following description contains specific information pertaining to example implementations in the present disclosure. The drawings in the present disclosure and their accompanying detailed description are directed to merely example implementations. However, the present disclosure is not limited to merely these example implementations. Other variations and implementations of the present disclosure will occur to those skilled in the art. Unless noted otherwise, like or corresponding elements among the figures may be indicated by like or corresponding reference numerals. Moreover, the drawings and illustrations in the present disclosure are generally not to scale, and are not intended to correspond to actual relative dimensions.

For the purpose of consistency and ease of understanding, like features may be identified (although, in some examples, not shown) by the same numerals in the example figures. However, the features in different implementations may be differed in other respects, and thus shall not be narrowly confined to what is shown in the figures.

The description uses the phrases "in one implementation," or "in some implementations," which may each refer to one or more of the same or different implementations. The term "comprising," when utilized, means "including, but not necessarily limited to"; it specifically indicates open-ended inclusion or membership in the so-described combination, group, series and the equivalent. The expression "at least one of A, B and C" or "at least one of the following: A, B and C" means "only A, or only B, or only C, or any combination of A, B and C."

Additionally, for the purposes of explanation and non-limitation, specific details, such as functional entities, techniques, protocols, standard, and the like are set forth for providing an understanding of the described technology. In other examples, detailed description of well-known methods, technologies, systems, architectures, and the like are omitted so as not to obscure the description with unnecessary details.

FIG. 1 illustrates a folding region of a display panel in accordance with a related art display 100. The display 100 in FIG. 1 may have a single unbroken shock absorber that is bonded continuously to the display panel. As shown in FIG. 1, when folded, the various layers of the display 100 have different radii of curvature because of their different positions. For example, the radius of curvature 2 (RoC2) of an outer layer 104 is substantially greater than the radius of curvature 1 (RoC1) of an inner layer 102. This means that different lengths of each layer are present in the folding region 160. As illustrated in FIG. 1, the bending length 2 (BL2) of the outer layer 104 is substantially greater than the bending length 1 (BL1) of the inner layer 102. If there was no adhesive between layers, the layers would freely slip past one another and adopt a relaxed state in which stress in the layers is minimised. When adhesive is included between the layers the slip between layers is constrained and complete relaxation is not possible. The interaction between the layers due to the adhesive increases stress, which is undesirable because it increases the likelihood of failure. FIG. 1 illustrates the display 100 being folded 90 degrees (e.g., an L-shape fold). The various layers in the folding region 160 will subject to even more stress, in a case where the display 100 is folded 180 degrees (e.g., a U-shape fold), thus more likely to fail, for example, due to cracking or buckling.

Figures 2A, 2B:
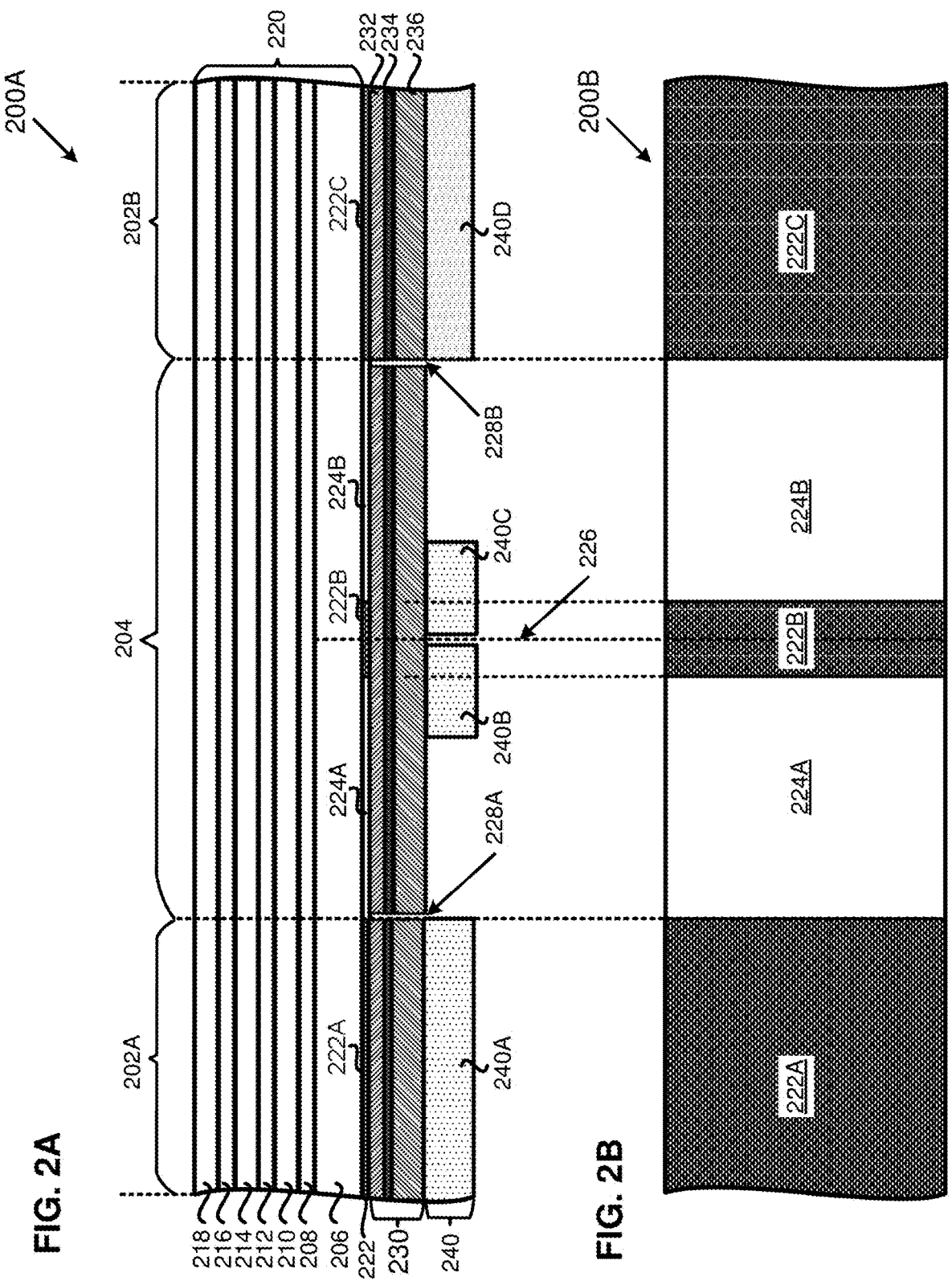
FIG. 2A is a cross-sectional view of a portion of a display structure, in accordance with an example implementation of the present disclosure.
FIG. 2B is a top plan view of the display device shown in FIG. 2A, in accordance with an example implementation of the present disclosure.

FIG. 2A is a cross-sectional view of a portion of a display structure, in accordance with an example implementation of the present disclosure. FIG. 2B is a top plan view of the display device shown in FIG. 2A, in accordance with an example implementation of the present disclosure.

As shown in FIG. 2A, an example display structure 200A includes non-folding regions 202A and 202B and a folding region 204 between the non-folding regions 202A and 202B. The display structure 200A includes a display panel 220 joined to a shock absorber 230 by adhesives in the non-folding regions 202A and 202B and in a portion of the folding region 204.

In the present implementation, the display panel 220 may include, but is not limited to, at least a display substrate 206, such as an OLED display, a quantum dot light emitting diode (QLED, QD-LED) display operating by electroluminescence or a micro-LED display. The LED comprising pixels (e.g., arrays or OLED subpixels) of the display may be operable as an active matrix display by way of a thin film transistor (TFT) backplane (e.g., controlling emission from each subpixel). The display panel 220 may further include at least one of a touch panel 210 (e.g., having touch sensors such as projected capacitive type touch sensor, not explicitly shown) and an optical polarizer 214 (e.g., a circular polarizer, not explicitly shown) and a cover window 218 (e.g. a polymer film ≈100 μm thick) which may be joined to each other and to the display substrate by adhesive layers (e.g., adhesive layers 208, 212, and 216). In one implementation of the present disclosure, at least one of the adhesive layers 208, 212, and 216 may include optically clear adhesive (OCA). In a preferred example implementation of the present disclosure, the configuration of the display panel 220 may include the display substrate 206, the touch panel 210, the optical polarizer 214, and the cover window 218.

In the present implementation, the shock absorber 230 may include, but is not limited to, a high stiffness layer 232, a joining layer 234, and a low stiffness layer 236. The high stiffness layer 232 may include a material which has a high stiffness (e.g., stainless steel ≈30 μm thick, Young's modulus ≈200 GPa). The joining layer 234 (e.g., a bonding agent) joins the high stiffness layer 232 and the low stiffness layer 236. The low stiffness layer 236 may include a material which has a low stiffness (e.g., polyurethane ≈50 μm thick, Young's modulus ≈50 MPa or acrylic foam ≈50 μm thick, Young's modulus ≈2 MPa). The low stiffness layer 236 may have a laminate or composite structure of different materials, for example polyurethane (e.g., equal or less than 40 μm thick) sandwiched between layers of polyethylene terephthalate (e.g., equal or less than 25 μm thick).

In the present implementation, the shock absorber 230 is not a continuous layer. For example, as illustrated in FIG. 2A, the shock absorber 230 is divided into two or more regions which are physically separate. For example, as illustrated in FIG. 2A, the shock absorber 230 is divided where the folding region 204 and the non-folding region 202A meet (e.g., at boundary/interface 228A). The shock absorber 230 is also divided where the folding region 204 and the non-folding region 202B meet (e.g., at boundary/interface 228B). In the present implementation, in the non-folding regions 202A and 202B, the shock absorber 230 is continuously attached to the display substrate 206, opposite the touch panel 210, optical polariser 214 and cover window 218, using adhesives 222A and 222C, respectively.

By introducing one or more discontinuities in the shock absorber 230, the effect of the shock absorber 230 on the final shape of the display panel 220 can be reduced or eliminated, advantageously reducing the stress in the display panel 220. This configuration also advantageously allows the shock absorber 230 in the folding region 204 to adopt a folded shape which does not have an effect on the folded shape of the display panel 220, as shown in FIG. 3A (e.g., in the regions 324A and 324B) and in FIG. 3B (e.g., in the region 324B) below.

In the present implementation, the adhesive layer 222 is not a continuous layer. As illustrated in FIG. 2B, in the non-folding regions 202A and 202B, the adhesives 222A and 222C are continuous. In the folding region 204, the shock absorber 230 is attached to a portion of the display substrate 206, opposite the touch panel 210, optical polariser 214 and cover window 218, using adhesive 222B. It is noted that, in the folding region 204, there is no adhesive between the display substrate 206 and the shock absorber 230 in the regions 224A and 224B. As such, there is a gap (e.g., an air gap) between the display substrate 206 and the shock absorber 230 in each of the regions 224A and 224B of the folding region 204. These gaps in the regions 224A and 224B reduce the interaction between the shock absorber 230 and the display substrate 206 and thereby reducing stress in the various layers of the display panel 220 when folded. In a preferred example implementation, the adhesive 222B is disposed between the display substrate 206 and the shock absorber 230 along the centre line 226 (e.g., a folding plane, which may be a symmetry plane) of the folding region 204 when viewed along the axis of rotation. In another implementation, the adhesive 222B does not need to be disposed symmetrically along the centre line 226 between the display substrate 206 and the shock absorber 230.

In the present implementation, the thickness of the adhesive layer 222 bonding the shock absorber 230 to the display panel 220 is small. The adhesive layer 222 may have low stiffness to allow the high stiffness layer 232 of the shock absorber 230 and the rigid layer of the display substrate 206 to slide relative to one another during folding to prevent high stress in the layers causing failure by cracking. However, if the soft adhesive is thick it is able to undergo large deformation under impact despite the presence of the high stiffness shock absorber 230, which may cause failure of the display panel 220 (e.g. cracking of the TFT backplane, cracking of the thin film encapsulation, permanent (plastic) deformation of the touch panel). In one example implementation, the adhesive layer 222 may have a thickness of less than 25 µm. In another example implementation, the adhesive layer 222 may have a thickness of less than 15 µm. In yet another example implementation, the adhesive layer 222 may have a thickness of less than 5 µm. In yet another example implementation, the adhesive layer 222 may have a thickness of less than 2 µm.

As further illustrated in FIG. 2A, a housing members 240A and 240D are joined (e.g., mounted) to the shock absorber 230 in the non-folding regions 202A and 202B, respectively. A housing member 240B is joined (e.g., mounted) to the shock absorber 230 in the folding region 204 on one side of the centre line 226, while another housing member 240C is joined (e.g., mounted) to the shock absorber 230 in the folding region 204 on the opposite side of the centre line 226.

As shown in FIG. 2A, the display panel 220 in the folding region 204 is contacted by the housing members 240B and 240C. The adhesive 222B between the shock absorber 230 and the display substrate 206 is applied between locations where the contacts occur between the back of the shock absorber 230 and each of the housing members 240B and 240C. This configuration advantageously prevents delamination of the shock absorber 230 from the display substrate 206 in the folding region 204 when the display panel 220 is folded.

FIG. 3A is a cross-sectional view of a portion of a display structure in a folded state, in accordance with an example implementation of the present disclosure. In the present implementation, a display structure 300 includes a display panel 320, an adhesive layer 322, a shock absorber 330, and a housing layer 340. The display structure 300 includes non-folding regions 302A and 302B and a folding region 304 between the non-folding regions 302A and 302B. In FIG. 3A, the display structure 300 is in a "U-shape" folded state.

FIG. 3B is a cross-sectional view of a portion of the display structure 300 in FIG. 3A in another folded state, in accordance with an example implementation of the present disclosure. In FIG. 3B, the display structure 300 is in an "L-shape" folded state.

In one implementation, the display panel 320, the adhesive layer 322, the shock absorber 330, and the housing layer 340 in the display structure 300 in FIG. 3A and FIG. 3B may substantially correspond to the display panel 220, the adhesive layer 222, the shock absorber 230, and the housing layer 240 of the display structure 200A, respectively, in FIG. 2A. Thus, the details of the display panel 320, the adhesive layer 322, the shock absorber 330, and the housing layer 340 of the display structure 300 are omitted for brevity.

In the present implementation, the shock absorber 330 is not a continuous layer. For example, as illustrated in FIG. 3A, the shock absorber 330 is divided into two or more regions which are physically separate. For example, as illustrated in FIG. 3A, the shock absorber 330 is divided where the folding region 304 and the non-folding region 302A meet (e.g., at boundary/interface 328A). The shock absorber 330 is also divided where the folding region 304 and the non-folding region 302B meet (e.g., at boundary/interface 328B). In the present implementation, in the non-folding regions 302A and 302B, the shock absorber 330 is continuously attached to the display panel 320 using adhesives 322A and 322C, respectively.

In the folding region 304, the shock absorber 330 is attached to a portion of the display panel 320 using adhesive 322B. The adhesive layer 322 is not a continuous layer. As illustrated in FIG. 3A, in the folding region 304, there is no adhesive in the regions 324A and 324B between the display panel 320 and the shock absorber 330. In the present implementation of the present disclosure, adhesive 322B is disposed between the display panel 320 and the shock absorber 330 along the centre line 326 (e.g., a folding plane) in the folding region 304 when viewed along the axis of rotation. In the present implementation, the adhesives 322A and 322C are continuous in the non-folding regions 302A and 302B, respectively, of the display structure 300.

In the present implementation, in the folding region 304, there is no adhesive between the display substrate 306 and the shock absorber 330 in the regions 324A and 324B. As such, there is a gap (e.g., an air gap) between the display substrate 306 and the shock absorber 330 in each of the regions 324A and 324B of the folding region 304. These gaps in the regions 324A and 324B reduce the interaction between the shock absorber 330 and the display substrate 306 and thereby reducing stress in the various layers of the display panel 320 when folded. In a preferred example implementation, the adhesive 322B is disposed between the display substrate 306 and the shock absorber 330 along the centre line 326 (e.g., a folding plane, which may be a symmetry plane) of the folding region 304 when viewed along the axis of rotation. In another implementation, the adhesive 322B does not need to be disposed symmetrically along the centre line 326 between the display substrate 306 and the shock absorber 330.

In the present implementation, in addition to not having adhesive between the shock absorber 330 and the display panel 320 in the regions 324A and 324B, it is advantageous that the shock absorber 330 is not continuous. Specifically, it is preferable that the shock absorber 330 has at least one discontinuity either in the folding region 304 or at the boundary(ies)/interface(s) (e.g., 328A and/or 328B) between a folding region (e.g., 304) and a non-folding region (e.g., 302A or 302B).

This may be understood by considering what happens when a continuous shock absorber which is not bonded to a display panel is folded, and when a display panel which is not bonded to a shock absorber is folded. For an arbitrary folding geometry the final shape of the shock absorber and the final shape of the display panel will be different due to the different stiffnesses of the materials and different layer thicknesses. Therefore, even in the case that the shock absorber and the display panel are not continuously bonded by adhesive, the shock absorber may still affect the folded shape of the display panel due to physical contact between the two layers. The distortion from the relaxed shape of the display panel may increase the stress in the display panel, increasing the risk of panel failure.

By introducing one or more discontinuities in the shock absorber 330, the effect of the shock absorber 330 on the final shape of the display panel 320 can be reduced or eliminated, advantageously reducing the stress in the display panel 320. This configuration also advantageously allows the shock absorber 330 in the folding region 304 to adopt a folded shape which does not have an effect on the folded shape of the display panel 320, as shown in FIG. 3A (e.g., in the regions 324A and 324B) and in FIG. 3B (e.g., in the region 324B).

As shown in FIG. 3B, in the region 324A where there is no adhesive between the display panel 320 and the shock absorber 330, the gap between the display panel 320 and the shock absorber 330 is small when the display is in its unfolded ("open") state. As shown in FIG. 3B, the region 324 is in an unfolded state, the gap between the display panel 320 and the shock absorber 330 is small, since a large air gap would allow the display panel 320 to undergo deformation when an object impacts the display without the deformation being opposed by the high stiffness layer of the shock absorber 330. Thus, a large gap may lead to failure, such as permanent deformation of the layers of the display panel. The gap (e.g., an air gap) between the display panel 320 and the shock absorber 330 is preferably no larger than the adhesive thickness, and therefore preferably less than 25 μm. More preferably, the gap is less than 15 μm. More preferably, the gap is less than 5 μm. More preferably, the gap is less than 2 μm.

As further illustrated in FIG. 3A, a housing members 340A and 340D are joined (e.g., mounted) to the shock absorber 330 in the non-folding regions 302A and 302B, respectively. A housing member 340B is joined (e.g., mounted) to the shock absorber 330 in the folding region 304 on one side of the centre line 326, while another housing member 340C is joined (e.g., mounted) to the shock absorber 330 in the folding region 304 on the opposite side of the centre line 326.

As shown in FIG. 3A, the display panel 320 in the folding region 304 is contacted by the housing members 340B and 340C. The adhesive 322B between the shock absorber 330 and the display panel 320 is applied between locations where the contacts occur between the back of the shock absorber 330 and each of the housing members 340B and 340C.

In the present implementation, the position of the shock absorber 330 when the display panel 320 is folded may be controlled by the housing layer 340. For example, as shown in FIG. 3A, the position of the shock absorber 330 in the folding region 304 is controlled by the housing members 340A and 340B, which press the shock absorber 330 against the adhesive 322B when the display panel 320 is folded. Thus, the housing members 340A and 340B can prevent delamination of the shock absorber 330 from the display panel 320 in the folding region 304 when the display panel 320 is folded.

In some implementations, the small gap between the shock absorber 330 and the display panel 320 in the regions where they are not joined by adhesive does not need to be maintained when the display is folded ("closed").

In some implementations, in a folded state, the display structure 300 may not need to be visible to the user. Therefore, the housing layer 340 which mounts the display panel 320 and the shock absorber 330 is configured to prevent objects from impacting the display panel 320.

FIG. 4A is a cross-sectional view of a portion of a display structure in a folded state, in accordance with an example implementation of the present disclosure. In the present implementation, a display structure 400 includes a display panel 420, an adhesive layer 422, a shock absorber 430, and a housing layer 440. The display structure 400 includes non-folding regions 402A and 402B and a folding region 404 between the non-folding regions 402A and 402B. In FIG. 4A, the display structure 400 is in a "U-shape" folded state.

FIG. 4B is a cross-sectional view of a portion of the display structure 400 in FIG. 4A in another folded state, in accordance with an example implementation of the present disclosure. In FIG. 4B, the display structure 400 is in an "L-shape" folded state.

In one implementation, the display panel 420, the adhesive layer 422, the shock absorber 430, and the housing layer 440 in the display structure 400 in FIG. 4A and FIG. 4B may substantially correspond to the display panel 220, the adhesive layer 222, the shock absorber 230, and the housing layer 240 of the display structure 200A, respectively, in FIG. 2A. In one implementation, the display panel 420, the adhesive layer 422, the shock absorber 430, and the housing layer 440 in the display structure 400 in FIG. 4A and FIG. 4B may substantially correspond to the display panel 320, the adhesive layer 322, the shock absorber 330, and the housing layer 340 of the display structure 300 respectively, in FIGS. 3A and 3B. Thus, the details of display panel 420, the adhesive layer 422, the shock absorber 430, and the housing layer 440 of the display structure 400 are omitted for brevity.

In the present implementation, the shock absorber 430 is not a continuous layer. For example, as illustrated in FIG. 4A, the shock absorber 430 is divided into two or more regions which are physically separate. For example, as illustrated in FIG. 4A, the shock absorber 430 is divided where the folding region 404 and the non-folding region 402A meet (e.g., at boundary/interface 428A). The shock absorber 430 is also divided where the folding region 404 and the non-folding region 402B meet (e.g., at boundary/interface 428B). In the present implementation, in the non-folding regions 402A and 402B, the shock absorber 430 is continuously attached to the display panel 420, using adhesives 422A and 422C, respectively.

In the folding region 404, the shock absorber 430 is attached to a portion of the display panel 420 using adhesive 422B. The adhesive layer 422 is not a continuous layer. As illustrated in FIG. 4A, in the folding region 404, there is no adhesive in the regions 424A and 424B between the display panel 420 and the shock absorber 430. In the present implementation of the present disclosure, adhesive 422B is disposed between the display panel 420 and the shock absorber 430 along the centre line 426 (e.g., a folding plane, which may be a symmetry plane) in the folding region 404 when viewed along the axis of rotation. In the present implementation, the adhesives 422A and 422C are continuous in the non-folding regions 402A and 402B, respectively, of the display structure 400.

In the present implementation, in the folding region 404, there is no adhesive between the display substrate 406 and the shock absorber 430 in the regions 424A and 424B. As such, there is a gap (e.g., an air gap) between the display substrate 406 and the shock absorber 430 in each of the regions 424A and 424B of the folding region 404. These gaps in the regions 424A and 424B reduce the interaction between the shock absorber 430 and the display substrate 406 and thereby reducing stress in the various layers of the display panel 420 when folded. In a preferred example implementation, the adhesive 422B is disposed between the display substrate 406 and the shock absorber 430 along the centre line 426 (e.g., a folding plane) of the folding region 404 when viewed along the axis of rotation. In another implementation, the adhesive 422B does not need to be disposed symmetrically along the centre line 426 between the display substrate 406 and the shock absorber 430.

In the present implementation, in addition to not having adhesive between the shock absorber 430 and the display panel 420 in the regions 424A and 424B, it is advantageous that the shock absorber 430 is not continuous. Specifically, it is preferable that the shock absorber 430 has at least one discontinuity either in the folding region 404 or at the boundary(ies)/interface(s) (e.g., 428A and/or 428B) between a folding region (e.g., 404) and a non-folding region (e.g., 402A or 402B).

By introducing one or more discontinuities in the shock absorber 430, the effect of the shock absorber 430 on the final shape of the display panel 420 can be reduced or eliminated, advantageously reducing the stress in the display panel 420. This configuration also advantageously allows the shock absorber 430 in the folding region 404 to adopt a folded shape which does not have an effect on the folded shape of the display panel 420, as shown in FIG. 4A (e.g., in the regions 424A and 424B) and in FIG. 4B (e.g., in the region 424B).

Different from the display structure 200A in FIG. 2A and the display structure 300 in FIGS. 3A and 3B, in the display structure 400, the adhesive 422B covers more areas in the folding region 404 than the adhesive 222B in the display structure 200A (or the adhesive 322B in the display structure 300), thus leaving less space for the regions 424A and 424B. The additional adhesive in the folding region 404 results in the shock absorber 430 substantially following the folded shape of the display panel 420. As compared to the display structure 300 in FIG. 3A, the display structure 400 in the U-shape folded state has a more rounded "teardrop" shape due to the additional adhesive in the folding region 404.

As illustrated in FIG. 4A, the shock absorber 430 below the region 424A follows the curvature of the display panel 420 after the adhesive 422B terminates at the point of inflection 444A (e.g., zero curvature) in the folding region 404. Similarly, the shock absorber 430 below the region 424B also follows the curvature of the display panel 420 after the adhesive 422B terminates at the point of inflection 444B (e.g., zero curvature) in the folding region 404.

It is noted that the portion of the display structure 400 in the folding region 404 between the point of inflection 444A and the centre line 426 is an inward bending region 446A. The portion of the display structure 400 in the folding region 404 between the point of inflection 444B and the centre line 426 is another inward bending region 446B. The portion of the display structure 400 in the folding region 404 between the point of inflection 444A and the bounty 428A is an outward bending region 448A. The portion of the display structure 400 in the folding region 404 between the point of inflection 444B and the bounty 428B is an outward bending region 448B. Thus, the folding region 404 includes at least one inward bending region and at least one outward bending region.

As further illustrated in FIG. 4A, a housing members 440A and 440D are joined (e.g., mounted) to the shock absorber 430 in the non-folding regions 402A and 402B, respectively. A housing member 440B is joined (e.g., mounted) to the shock absorber 430 in the folding region 404 on one side of the centre line 426, while another housing member 440C is joined (e.g., mounted) to the shock absorber 430 in the folding region 404 on the opposite side of the centre line 426.

As shown in FIG. 4A, the display panel 420 in the folding region 404 is contacted by the housing members 440B and 440C. The adhesive 422B between the shock absorber 430 and the display panel 420 is applied between locations where the contacts (e.g., at the points of inflection 444A and 444B) occur between the back of the shock absorber 430 and each of the housing members 440B and 440C. In one implementation, since the adhesive 422B is disposed at the points of inflection 444A and 444B, the housing members 440B and 440C may be omitted since the stress at the points of inflection 444A and 444B (e.g., zero curvature) is at a minimum.

In the present implementation, the position of the shock absorber 430 when the display panel 420 is folded may be controlled by the housing layer 440. For example, as shown in FIG. 4A, the position of the shock absorber 430 in the folding region 404 is controlled by the housing members 440B and 440C, which press the shock absorber 430 against the adhesive 422B when the display panel 420 is folded. Thus, the housing members 440B and 440C can prevent delamination of the shock absorber 430 from the display panel 420 in the folding region 404 when the display panel 420 is folded.

In some implementations, the small gap between the shock absorber 430 and the display panel 420 in the regions (e.g., 424A and 424B) where they are not joined by adhesive does not need to be maintained when the display is folded ("closed").

In some implementations, in a folded state, the display structure 400 may not need to be visible to the user. Therefore, the housing layer 440 which mounts the display panel 420 and the shock absorber 430 is configured to prevent objects from impacting the display panel 420.

According to one implementation of the present disclosure, the shock absorber is configured to have one or more recesses in at least a folding region. In at least these folding regions, the adhesive which joins the shock absorber to the display substrate is wholly within the recessed areas of the shock absorber. Furthermore, the depth of the recess is configured to be close to, but not exceed, the thickness of the adhesive in these folding regions. This reduces the separation between the shock absorber and the display substrate in the folding region of the display panel. In addition to increasing the robustness against impact by reducing the air gap, the reduction in the air gap between the shock absorber and the display substrate when the display is not folded has additional advantages.

Figure 5A:
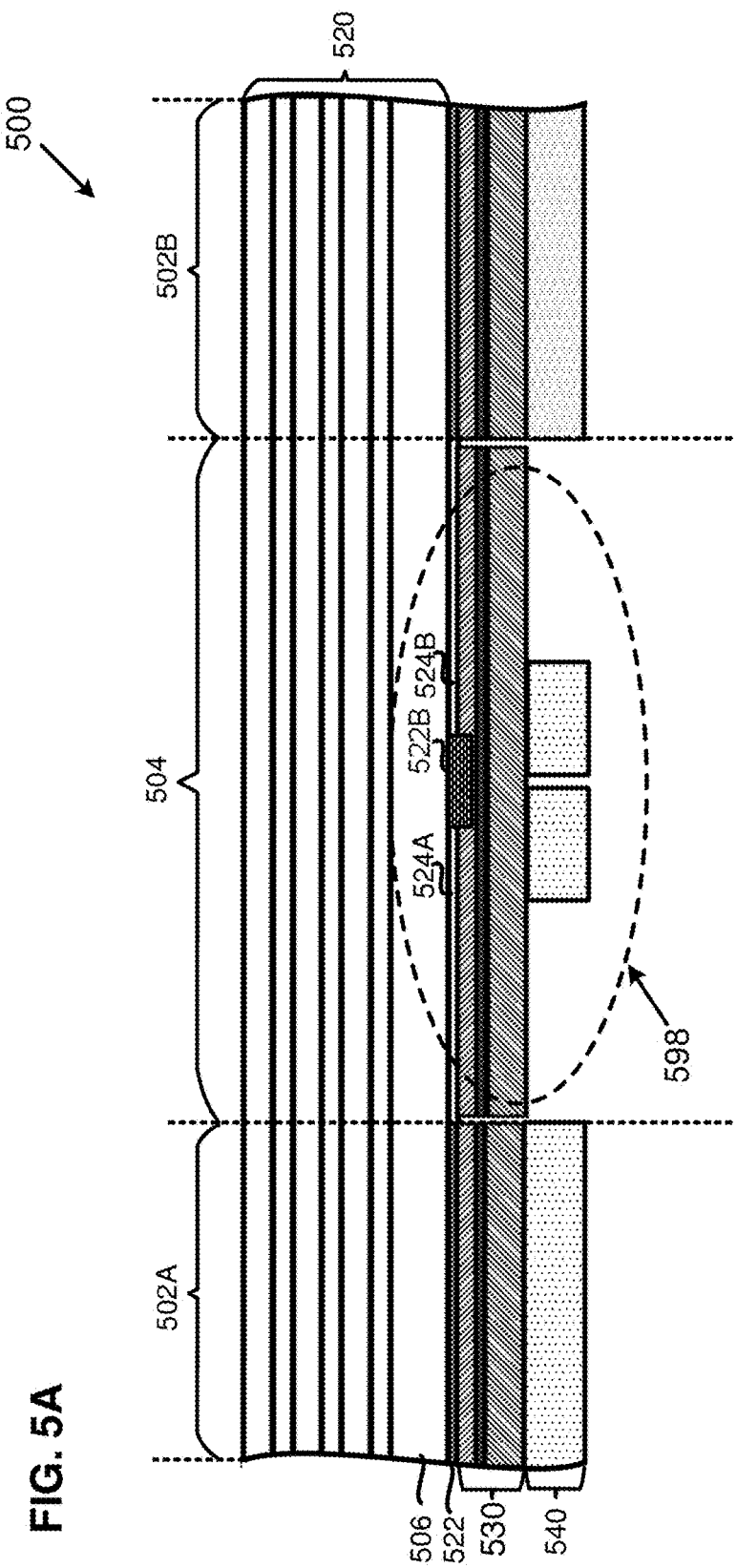
FIG. 5A is a cross-sectional view of a portion of a display structure, in accordance with an example implementation of the present disclosure.

FIG. 5A is a cross-sectional view of a portion of a display structure, in accordance with an example implementation of the present disclosure. As shown in FIG. 5A, an example display structure 500 includes non-folding regions 502A and 502B and a folding region 504 between the non-folding regions 502A and 502B. The display structure 500 includes a display panel 520 joined to a shock absorber 530 by adhesives in the non-folding regions 502A and 502B and in a portion of the folding region 504.

In one implementation, the display panel 520, the adhesive layer 522, the shock absorber 530, and the housing layer 540 in the display structure 500 in FIG. 5A may substantially correspond to the display panel 220, the adhesive layer 222, the shock absorber 230, and the housing layer 240 of the display structure 200A, respectively, in FIG. 2A. Thus, the details of the display panel 520, the adhesive layer 522, the shock absorber 530, and the housing layer 540 are omitted for brevity.

Figure 5B:
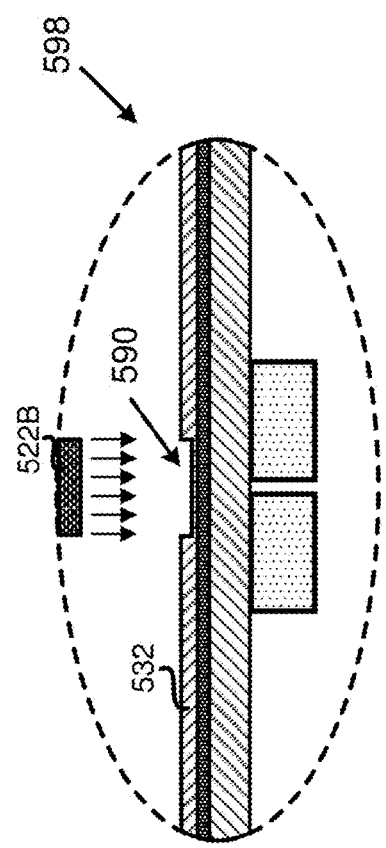
FIG. 5B illustrates a portion of the display structure shown in FIG. 5A, in accordance with an example implementation of the present disclosure.

FIG. 5B illustrates a portion of the display structure 500 shown in FIG. 5A, in accordance with an example implementation of the present disclosure. As shown in FIG. 5B, in a region 598 of the display structure 500 in FIG. 5A, the shock absorber 530 is configured to have at least one recess 590 in the high stiffness layer 532 in the folding region 504. In the folding region 504, the adhesive 522B which joins the shock absorber 530 to the display substrate 506 is wholly within the recessed areas of the shock absorber 530. The depth of the recess 590 is configured to be close to, but not exceed, the thickness of the adhesive 522B in the folding region 504. This reduces the separation between the shock absorber 530 and the display substrate 506 in the folding region 504 of the display panel 520. In addition to increasing the robustness against impact by reducing the gaps in the regions 524A and 524B, the reduction in the gaps between the shock absorber 530 and the display substrate 506 when the display is not folded has additional advantages.

For example, a method for interacting with a display is by touching the display with an object such as a finger or stylus. A gap (e.g., an air gap) permits the display to deflect away from the object when it contacts the display, which can cause display artefacts, such as unintended changes in colour around the point of contact. This deflection may also result in the display feeling soft when touched in the folding region where there is a gap, which is an undesirable quality for the display to possess. By minimizing the gaps, these undesirable properties are reduced because the display panel cannot deflect as far before it contacts the high stiffness layer of the shock absorber.

While the recess 590 is described as being in the shock absorber 530, it should be understood that there may be recesses in the display substrate 506 instead or as well as in the shock absorber 530 to achieve the same result of minimizing the gaps (e.g., air gaps) between the shock absorber 530 and the display substrate 506.

According to one implementation of the present disclosure, the structure of the shock absorber may be different on either side of a discontinuity of the shock absorber. For example, the thickness or material of one or more of the layers in the shock absorber may be different. For example, the thickness of the high stiffness layer of the shock absorber is larger in a non-folding region of the display than in a folding region of the display. The thicknesses of the high stiffness layer may then be configured to optimise different properties. For example, the high stiffness layer in the non-folding region may be relatively thicker to increase the robustness of the display to impact in the non-folding region. The high stiffness layer in the folding region may be relatively thinner to optimise the folding performance of the shock absorber, such as ensuring that the layers of the shock absorber do not exceed their yield stress and permanently deform during folding.

Figure 6A:
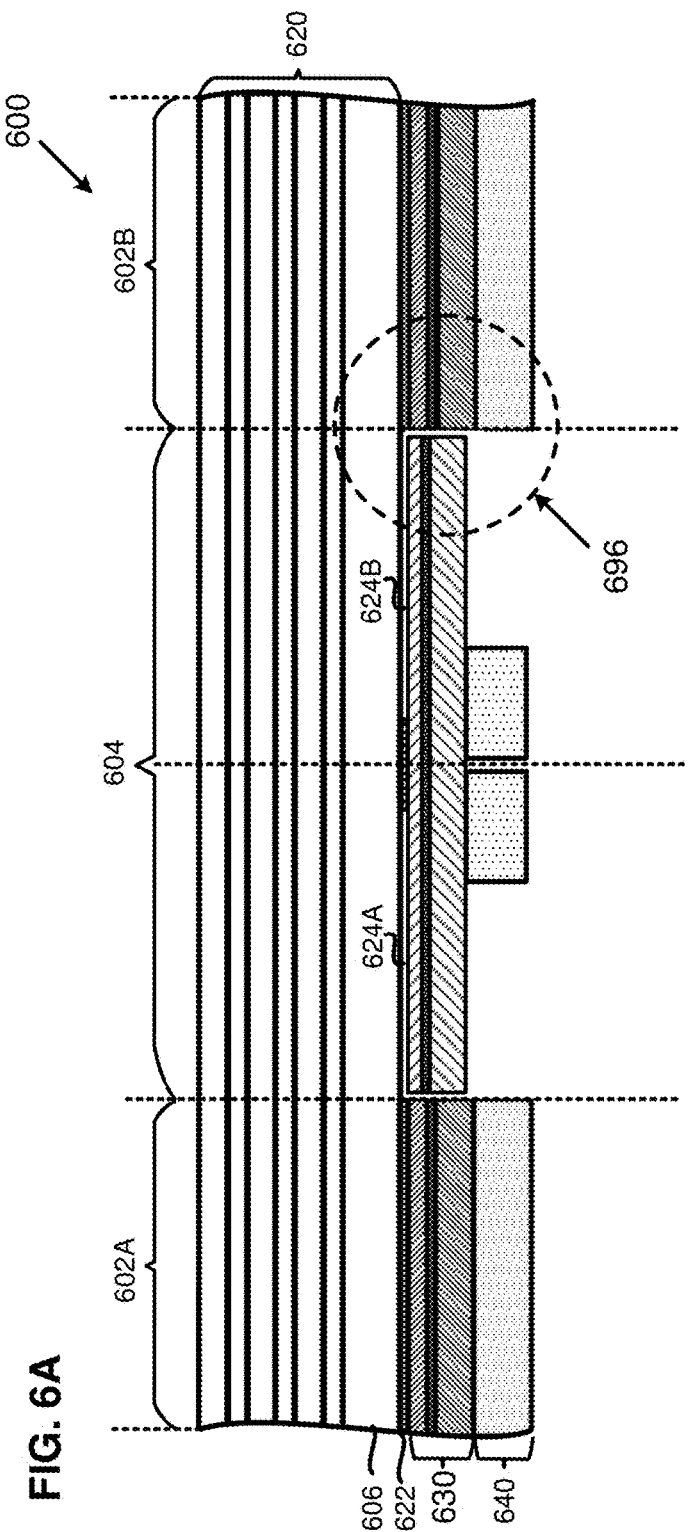
FIG. 6A is a cross-sectional view of a portion of a display structure, in accordance with an example implementation of the present disclosure.

FIG. 6A is a cross-sectional view of a portion of a display structure, in accordance with an example implementation of the present disclosure. As shown in FIG. 6A, an example display structure 600 includes non-folding regions 602A and 602B and a folding region 604 between the non-folding regions 602A and 602B. The display structure 600 includes a display panel 620 joined to a shock absorber 630 by adhesives in the non-folding regions 602A and 602B and in a portion of the folding region 604.

In one implementation, the display panel 620, the adhesive layer 622, the shock absorber 630, and the housing layer 640 in the display structure 600 in FIG. 6A may substantially correspond to the display panel 220, the adhesive layer 222, the shock absorber 230, and the housing layer 240 of the display structure 200A, respectively, in FIG. 2A. Thus, the details of the display panel 620, the adhesive layer 622, the shock absorber 630, and the housing layer 640 are omitted for brevity.

Figure 6B:
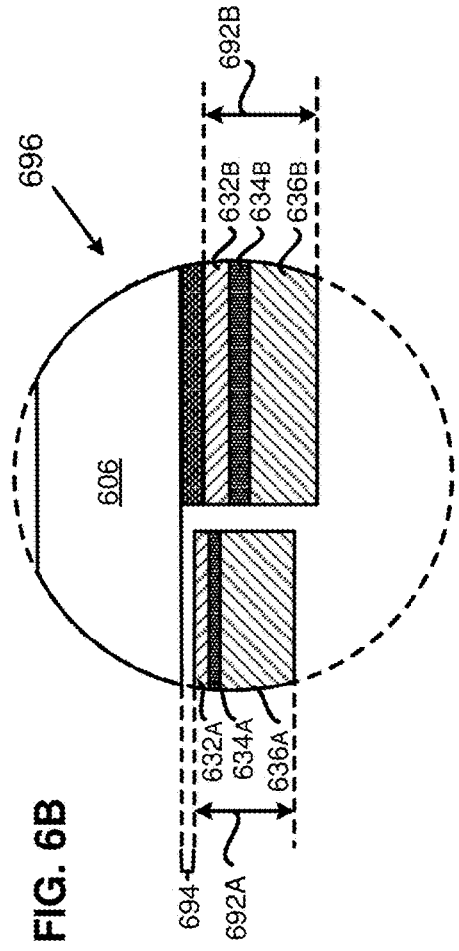
FIG. 6B illustrates a portion of the display structure shown in FIG. 6A, in accordance with an example implementation of the present disclosure.

FIG. 6B illustrates a portion of the display structure 600 shown in FIG. 6A, in accordance with an example implementation of the present disclosure. As shown in FIG. 6B, in a region 696 of the display structure 600 in FIG. 6A, the thickness 692A of the shock absorber 630 in the folding region 604 is smaller than the thickness 692B of the shock absorber 630 in the non-folding region 602A or 602B.

For example, the high stiffness layer 632B in the non-folding region 602A/602B may be relatively thicker to increase the robustness of the display structure 600 to impact in the non-folding region. The high stiffness layer 632A in the folding region 604 may be relatively thinner to optimise the folding performance of the shock absorber 630, such as ensuring that the layers of the shock absorber do not exceed their yield stress and permanently deform during folding. In the present implementation, the joining layer 634A in the folding region 604 and the joining layer 634B in the non-folding region 602A/602B have the same thickness. The low stiffness layer 636A in the folding region 604 and the low stiffness layer 636B in the non-folding region 602A/602B have the same thickness. In other implementations, the joining layer 634A in the folding region 604 and the joining layer 634B in the non-folding region 602A/602B may have different thicknesses. The low stiffness layer 636A in the folding region 604 and the low stiffness layer 636B in the non-folding region 602A/602B may have different thicknesses.

In an implementation in which the joining layer 634A in the folding region 604 has a lower thickness relative to the joining layer 634B in the non-folding region 602A/602B, the separation distance 694 between the shock absorber 630 and the display substrate 606 in the folding region 604 of the display panel 620 is reduced. In addition to increasing the robustness against impact by reducing the gaps in the regions 624A and 624B, the reduction in the gaps between the shock absorber 630 and the display substrate 606 when the display is not folded has additional advantages as mentioned above.

Although the implementations in the display structure 500 in FIGS. 5A and 5B and in the display structure 600 in FIGS. 6A and 6B show separate implementations, by using a recess in the high stiffness layer and by reducing the thickness of the high stiffness layer in the folding region, respectively, to minimize the gaps between the display substrate and the shock absorber, it should be understood that these two methods can be combined to have a high stiffness layer with reduced thickness and one or more recesses to minimise the gap between the display substrate and the shock absorber in the folding region. In yet another implementation, a high stiffness layer with one or more recesses and a joining layer with reduced thickness may be combined to minimise the gap between the display substrate and the shock absorber in the folding region.

In accordance with an example implementation of the present disclosure, for a display device configured to exist in two different states (e.g. a "closed state" in which the folding region of the display device has a first curvature, and an "open state" in which the folding region of the display has a second curvature), the high stiffness layer of the shock absorber in the folding region is relaxed (has zero stress) for a third curvature, which is between the first curvature and the second curvature. Preferably the third curvature is approximately midway between the first curvature and the second curvature. This minimises the peak stress in the high stiffness layer of the shock absorber across all curvatures between the first curvature and the second curvature. This may be used to advantageously increase the thickness of the high stiffness layer of the shock absorber without it yielding and permanently deforming during folding, for example, to increase the robustness of the folding region of the display panel to impact.

FIG. 7A is a cross-sectional view of a portion of a display structure in an open state, in accordance with an example implementation of the present disclosure. FIG. 7B is a cross-sectional view of a portion of the display structure in FIG. 7A in a closed state, in accordance with an example implementation of the present disclosure. The hinges 780A and 780B that dictate the folding paths of the display structures 700A and 700B. The hinges 780A and 780B are configured such that the centre of the folding region of the display panel does not move relative to the axis or axes of rotation.

In some implementations of the present disclosure, if a display device is configured to have a first folding region which is folded inwards and a second folding region which is folded outwards, there is no adhesive between the shock absorber and the display substrate in the second folding region. The outward folding region is particularly susceptible to the increase in stress caused by joining the shock absorber to the display substrate with adhesive.

In some implementations of the present disclosure, if a display device is configured such that the folding region has a mirror symmetry plane, then the adhesive is symmetrical about the symmetry plane of the fold. This advantageously ensures that there will be no deviation of the folded display panel from its relaxed folded shape, minimising stress in the layers of the display panel.

In some implementations of the present disclosure, a gap between the between the display substrate and the shock absorber may be partially or completely filled with a soft compressible material such as acrylic foam bonded to either the display substrate or the shock absorber (but not both). This advantageously reduces deflection of the display panel during touch interactions with the display while relaxing manufacturing tolerances associates with achieving a very small air gap and not increasing stresses during bending because the foam does not bond the display substrate to the shock absorber.

From the above descriptions, it is manifested that various techniques may be used for implementing the concepts described in the present application without departing from the scope of those concepts. Moreover, while the concepts have been described with specific reference to certain implementations, a person of ordinary skill in the art may recognize that changes may be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

What is claimed is:

1. A shock-absorbing display panel apparatus for folding flat screen displays, the apparatus comprising:
a planar display layer comprising a viewing surface and an opposing non-viewing surface, and at least one folding region and at least one non-folding region for folding along at least one axis of rotation;
a shock absorber in co-planar peripheral contour with the display layer, the shock absorber having at least one first discontinuity sub-dividing the shock absorber into physically separate regions; and
an adhesive layer disposed between the shock absorber and the non-viewing surface,
wherein the adhesive layer has at least one second discontinuity between the shock absorber and the display panel in the at least one folding region of the display layer.

2. The apparatus of claim 1, wherein the at least one folding region comprises at least one inward-bending region, and at least one outward-bending region.

3. The apparatus of claim 2, wherein the adhesive layer is discontinuous at one or more points of inflection between the at least one inward-bending region and the at least one outward-bending region.

4. The apparatus of claim 1, wherein the adhesive layer is symmetrical about a plane of the at least one folding region when the at least one folding region has a mirror symmetry plane.

5. The apparatus of claim 1, wherein the at least one second discontinuity of the adhesive layer comprises an air gap between the display layer and the shock absorber.

6. The apparatus of claim 5, wherein the air gap is less than twenty five micrometers in thickness.

7. The apparatus of claim 1, wherein the adhesive layer is continuous under the at least one non-folding region.

8. The apparatus of claim 1, wherein the adhesive layer is continuous under a center line of the at least one axis of rotation.

9. The apparatus of claim 1, wherein the adhesive layer has a thickness of less than twenty five micrometers.

10. The apparatus of claim 1, wherein the shock absorber is continuous under the at least one non-folding region.

11. The apparatus of claim 1, wherein the at least one first discontinuity of the shock absorber is at an interface of the at least one folding region and the at least one non-folding region.

12. The apparatus of claim 1, wherein the shock absorber comprises a first layer, a second layer having a stiffness greater than the first layer, and a bonding agent between the first layer and the second layer.

13. The apparatus of claim 12, wherein the second layer of the shock absorber and the display layer each have a higher stiffness than the adhesive layer, such that the shock absorber is configured to slide relative to the display layer while remaining attached to the adhesive layer.

14. The apparatus of claim 12, wherein the second layer of the shock absorber comprises a recess for accommodating the adhesive layer.

15. The apparatus of claim 12, wherein the second layer of the shock absorber is thinner in the at least one folding region.

16. The apparatus of claim 1, further comprising at least one housing section, wherein the shock absorber is disposed between the at least one housing section and the adhesive layer.

17. The apparatus of claim 16, wherein the at least one housing section is disposed adjacent the shock absorber at the at least one second discontinuity of the adhesive layer.

18. The apparatus of claim 16, wherein the at least one housing section is coupled to the shock absorber such that a position of the shock absorber relative to the display layer is controlled.

19. The apparatus of claim 1, wherein the at least one folding region comprises two axes of rotation.

20. The apparatus of claim 1, further comprising a hinge, wherein the hinge is configured to control a folding path of the display panel such that a center of the at least one folding region does not move relative to the at least one axis of rotation.

\* \* \* \* \*